(12) United States Patent
Merricks et al.

(10) Patent No.: US 6,660,154 B2
(45) Date of Patent: Dec. 9, 2003

(54) SEED LAYER

(75) Inventors: David Merricks, Coventry (GB); Denis Morrissey, Huntington, NY (US); Martin W. Bayes, Hopkinton, MA (US); Mark Lefebvre, Hudson, NH (US); James G. Shelnut, Northboro, MA (US); Donald E. Storjohann, Watertown, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 09/981,851

(22) Filed: Oct. 17, 2001

(65) Prior Publication Data

US 2002/0084193 A1 Jul. 4, 2002

Related U.S. Application Data

(60) Provisional application No. 60/243,085, filed on Oct. 25, 2000.

(51) Int. Cl.⁷ .................. C23C 28/00; C23C 28/02; C25D 5/34; C25D 7/12
(52) U.S. Cl. .................. 205/183; 205/184; 205/210; 205/157
(58) Field of Search .............. 427/421, 430.1, 427/241; 205/210, 183, 187, 184, 157; 106/1.11

(56) References Cited

U.S. PATENT DOCUMENTS

| | | | |
|---|---|---|---|
| 3,011,920 A | 12/1961 | Shipley | 117/213 |
| 4,681,630 A | 7/1987 | Brasch | |
| 4,762,560 A * | 8/1988 | Brasch | 106/1.11 |
| 5,750,018 A | 5/1998 | Brasch | 205/295 |
| 6,156,626 A * | 12/2000 | Bothra | 438/470 |
| 6,236,115 B1 * | 5/2001 | Gaynes et al. | 257/774 |
| 6,444,110 B2 * | 9/2002 | Barstad et al. | 205/123 |
| 2002/0000382 A1 | 1/2002 | Morrissey et al. | |
| 2002/0053519 A1 | 5/2002 | Morrissey et al. | |
| 2002/0066671 A1 | 6/2002 | Shelnut et al. | |
| 2002/0079232 A1 | 6/2002 | Shelnut | |
| 2002/0088713 A1 | 7/2002 | Merricks et al. | |
| 2002/0090484 A1 | 7/2002 | Merricks et al. | |

FOREIGN PATENT DOCUMENTS

| | | |
|---|---|---|
| EP | 0 707 093 A | 4/1996 |
| EP | 707093 A1 * | 4/1996 |
| WO | WO 99/47731 | 9/1999 |
| WO | WO 00 41235 A | 7/2000 |

OTHER PUBLICATIONS

Suhir, "The Future of Microelectronics and Photonics, and the Role of Mechanical, Materials and Reliability Engineering", Outline of a Key–Note Talk, Micromat 2000, Apr. 17–19, 2000, Berlin, Germany.*

Patent Abstracts of Japan, vol. 12, No. 387 (C–536), Oct. 14, 1988 & JP 63 130779A (NEC Corp), Jun. 2, 1998 –abstract–.

* cited by examiner

*Primary Examiner*—Edna Wong
(74) *Attorney, Agent, or Firm*—S. Matthew Cairns

(57) ABSTRACT

Disclosed are methods for repairing or enhancing discontinuous metal seed layers prior to subsequent metallization during the manufacture of electronic devices. Such repair methods do not require the use of a second electroplating bath.

18 Claims, No Drawings

SEED LAYER

This application claims the benefit of U.S. Provisional Application(s) No(s).: 60/243,085 filing date Oct. 25, 2000.

BACKGROUND OF THE INVENTION

This invention relates generally to the field of seed layers for subsequent metallization. In particular, this invention relates to methods for repairing seed layers prior to metallization.

The trend toward smaller microelectronic devices, such as those with sub-micron geometries, has resulted in devices with multiple metallization layers to handle the higher densities. One common metal used for forming metal lines, also referred to as wiring, on a semiconductor wafer is aluminum. Aluminum has the advantage of being relatively inexpensive, having low resistivity, and being relatively easy to etch. Aluminum has also been used to form interconnections in vias to connect the different metal layers. However, as the size of via/contact holes shrinks to the sub-micron region, a step coverage problem appears which in turn can cause reliability problems when using aluminum to form the interconnections between the different metal layers. Such poor step coverage results in high current density and enhances electromigration.

One approach to providing improved interconnection paths in the vias is to form completely filled plugs by using metals such as tungsten while using aluminum for the metal layers. However, tungsten processes are expensive and complicated, tungsten has high resistivity, and tungsten plugs are susceptible to voids and form poor interfaces with the wiring layers.

Copper has been proposed as a replacement material for interconnect metallizations in the manufacture of integrated circuits. Copper has the advantages of improved electrical properties as compared to tungsten and better electromigration property and lower resistivity than aluminum. The drawbacks to copper are that it is more difficult to etch as compared to aluminum and tungsten and it has a tendency to migrate into the dielectric layer, such as silicon dioxide. To prevent such migration, a barrier layer, such as titanium nitride, tantalum nitride and the like, must be used prior to the depositing of a copper layer.

Typical techniques for applying a metal layer, such as electrochemical deposition, are only suitable for applying copper to an electrically conductive layer. Thus, an underlying conductive seed layer, typically a metal seed layer such as copper, is generally applied to the substrate prior to electrochemically depositing copper. Such seed layers may be applied by a variety of methods, such as physical vapor deposition ("PVD") and chemical vapor deposition ("CVD"). Typically, seed layers are thin in comparison to other metal layers, such as from 50 to 1500 angstroms thick. Such metal seed layers, particularly copper seed layers, may suffer from problems such as metal oxide both on the surface of the seed layer and in the bulk of the layer as well as discontinuities in the layer.

Discontinuities or voids are areas in the seed layer where coverage of the metal, such as copper, is incomplete or lacking. Such discontinuities can arise from insufficient blanket deposition of the metal layer, such as depositing the metal in a line of sight fashion. In order for a complete metal layer to be electrochemically deposited on such a seed layer, the discontinuities must be filled in prior to or during the deposition of the final metal layer, or else voids in the final metal layer may occur.

PCT patent application number WO 99/47731 (Chen) discloses a method of providing a seed layer by first vapor depositing an ultra-thin seed layer followed by electrochemically enhancing the ultra-thin seed layer to form a final seed layer. According to this patent application, such a two step process provides a seed layer having reduced discontinuities, i.e. areas in the seed layer where coverage of the seed layer is incomplete or lacking. Conventional bottom-up or superfill copper electroplating baths are acid copper baths. Thus, one wishing to repair seed layer discontinuities using this approach with a conventional copper plating bath would need two electrolytic baths, an alkaline enhancing bath and an acidic copper electroplating bath. Thorough rinsing and neutralization of the seed layer before using conventional acidic electrolytic plating baths is required. In addition, a manufacturer using such alkaline enhancement method in combination with an acid electroplating bath would have to double the number of plating heads on the plating tool or throughput would decrease.

Colloidal copper has been used as a catalyst for electroless metal plating, particularly electroless copper plating. For example, U.S. Pat. Nos. 4,762,560 and 4,681,630 (Brasch) disclose colloidal copper containing small amounts of ionizable palladium as a catalyst for electroless copper baths, particularly slow electroless copper baths. Such catalyst is not disclosed for use in integrated circuit manufacture.

There is a continuing need for methods of repairing discontinuous seed layers without using a second electroplating bath. Such methods are particularly needed for plating of devices having very small geometries, such as 0.5 micron and below.

SUMMARY OF THE INVENTION

It has been surprisingly found that discontinuous metal seed layers may be repaired or enhanced according to the present invention without the use of an alkaline electroplating bath to provide metal seed layers substantially free of discontinuities.

In one aspect, the present invention provides a method of enhancing a discontinuous metal seed layer disposed on a substrate including the steps of: contacting a metal seed layer disposed on a substrate with a copper colloid composition including a minor amount of ionizable palladium compound and a major amount of copper colloid particles to form a substantially continuous seed layer.

In a second aspect, the present invention provides a method of electrodepositing a metal layer on the surface of a seed layer including the steps of: contacting a metal seed layer disposed on a substrate with a copper colloid composition including a minor amount of ionizable palladium compound and a major amount of copper colloid particles to form a substantially continuous seed layer; and contacting the substrate with an electroplating solution including one or more metal ions and an electrolyte.

In a third aspect, the present invention provides a method of manufacturing an electronic device including the steps of: contacting a metal seed layer disposed on an electronic device substrate with a copper colloid composition including a minor amount of ionizable palladium compound and a major amount of copper colloid particles to form a substantially continuous seed layer; and contacting the substrate with an electroplating solution including one or more metal ions and an electrolyte.

DETAILED DESCRIPTION OF THE INVENTION

As used throughout the specification, the following abbreviations shall have the following meanings, unless the context clearly indicates otherwise: nm=nanometers; g/L= grams per liter; μm=micron=micrometer; ASF=amperes per square foot; M=molar; and ppm=parts per million.

As used throughout the specification, "feature" refers to the geometries on a substrate, such as, but not limited to, trenches and vias. "Apertures" refer to recessed features, such as vias and trenches. The term "small features" refers to features that are one micron or smaller in size. "Very small features" refers to features that are one-half micron or smaller in size. Likewise, "small apertures" refer to apertures that are one micron or smaller ($\leq 1$ μm) in size and "very small apertures" refer to apertures that are one-half micron or smaller ($\leq 0.5$ μm) in size. As used throughout this specification, the term "plating" refers to metal electroplating, unless the context clearly indicates otherwise. "Deposition" and "plating" are used interchangeably throughout this specification. The term "accelerator" refers to a compound that enhances the plating rate. The term "suppressor" refers to a compound that suppresses the plating rate. "Halide" refers to fluoride, chloride, bromide, and iodide.

All percentages and ratios are by weight unless otherwise indicated. All ranges are inclusive and combinable.

The present invention provides methods of enhancing a discontinuous metal seed layer disposed on a substrate including the steps of: contacting a metal seed layer disposed on a substrate with a copper colloid composition including a minor amount of ionizable palladium compound and a major amount of copper colloid particles to form a substantially continuous seed layer. Such methods provide seed layers that are substantially free of discontinuities or voids and preferably free of discontinuities. Such seed layers preferably comprise copper or copper alloy. By "minor amount" is meant less than about 50%. Likewise, by "major amount" is meant greater than about 50%.

Suitable substrates are any that contain a seed layer for subsequent electrodeposition of a metal, and particularly a substrate used in the manufacture of an electronic device. Exemplary substrates include, but are not limited to, those containing one or more apertures having a size of $\leq 1$ μm, particularly $\leq 0.5$ μm, and more particularly $\leq 0.18$ μm. Such substrates particularly include wafers used in the manufacture of integrated circuits and semiconductors.

Suitable copper colloids useful in the present invention are those disclosed in U.S. Pat. No. 4,762,560 (Brasch), hereby incorporated by reference for all purposes. Copper colloid particles typically are prepared by combining one or more copper compounds, one or more stabilizing agents and one or more reducing agents. Suitable copper compounds are any which can be reduced by the one or more reducing agents. Such copper compounds include, but are not limited to, copper sulfate preferably the pentahydrate ($CuSO_4 5H_2O$), copper phosphite, copper phosphate, and copper sulfamate, copper acetate, copper chloride, copper nitrate, copper citrate, copper formate, copper gluconate, and the like. The relative amount of copper is not very critical although the copper compound should advantageously be present such that the amount of copper metal (zerovalent copper) is about 1 to 8 g/L of colloidal solution, preferably about 2.5 to 7.5 g/L and more advantageously in about 5 g/L. Thus, in the case of $CuSO_4 5H_2O$, the same should be present in about 10–30 g/L and most advantageously in about 20 g/L before reduction.

A wide variety of stabilizing agents may be used to form the copper colloid. The most advantageous stabilizing agent is gelatin. Other suitable stabilizing agents include, but are not limited to, polyvinyl alcohol, polyacrylamide, sodium alginate, polysorbate mono-oleate, dextrin (gums and starches), polyarylsulfonic acids such as polybenzenesulfonic acids and polyalkylnaphthalenesulfonic acids, and salts of, particularly alkali metal salts of, polyarylsulfonic acids such as salts of polybenzenesulfonic acids and salts of polyalkylnaphthalenesulfonic acids. The role of the stabilizing agent in the preparation of the colloids, or in the final colloid itself, is to stabilize the colloid. The colloid can be prepared in the absence of the stabilizing agent, and although useful, it is not sufficiently stable for competitive commercial use. The stabilizing agent should be preferably present in about 1 to 3 g/L of colloidal solution and most preferably in about 2 g/L.

Any of a wide variety of reducing agents are suitable for forming the copper colloid. Suitable reducing agents include, but are not limited to, hydrazine hydrate, potassium borohydride, sodium hydrosulfite, lithium borohydride, sodium borohydride, potassium diborane, dimethylamine borane ("DMAB"), and the like. Dimethylamine borane is preferred. Other reducing agents may be used but they should have a reducing power substantially the same as or equivalent to the preferred reducing agent DMAB under acid conditions. Preferably, when borohydride reducing agents are used, the pH of the solution is lowered to that approximately of DMAB. Combinations of reducing agents may be advantageously used. The relative amount of reducing agent is not very critical although the reducing agent should preferably be present in about 1 to 8 g/L of colloidal solution, preferably about 2.5 to 7.5 g/L and more preferably in about 5 g/liter and be in excess of that necessary for reducing the copper salt. Mixtures of reducing agents may suitably be used, although not preferred.

In line with the above, it can be seen that it is advantageous that the ratio of the one or more reducing agents to the amount of copper metal (zerovalent copper) is about 1/1 by weight or in excess.

The present copper colloids contain as a minor component ionizable palladium. A sufficient amount of palladium metal should be added to increase the coverage of the electrolytic copper deposit so as to substantially fill in or bridge the discontinuities. Typically, the amount of palladium metal is from about 5 to about 80 ppm, preferably from about 8 to about 80 ppm, more preferably from 12 to 75 ppm, and even more preferably from about 20 to about 50 ppm. The minimum amount of palladium metal depends to an extent upon the particular ionic palladium compound employed.

The upper limit of palladium metal in the colloid depends upon the particular ionic palladium compound used, the effect of the anion of the ionic palladium compound on the stability of the bath, and the stability of the activating colloid itself. Thus, the palladium is typically added in an amount which will retain the stability of the activating (colloid) solution. The addition of palladium metal in excess of about 80 ppm causes coagulation of the colloid and renders it unstable. The amount of palladium metal should thus be limited to about 80 ppm or below or to that amount which does not adversely affect the stability of the copper colloid. Thus, the maximum amount of palladium metal that is added is that which will retain sufficient stability of the colloid so that the non-conductive substrate can be adequately activated by the colloid for subsequent electrolytic plating.

The palladium is added to the colloid in the ionic state. Any palladium compound or salt capable of ionization and reduction can be used, such as the palladium chloride acid salt and palladium ammonium chloride; the latter being preferred. The addition of palladium metal, such as that contained in the commercial palladium/tin activating catalysts in the amount of 20 ppm of the palladium metal, causes some precipitation of the copper colloid, however such precipitate may be removed from the composition by filtration.

Thus, the present palladium containing copper colloid is typically prepared by dissolving one or more copper compounds and one or more stabilizing agents in water followed by the one or more reducing agents. The ionic palladium added to the copper colloid is reduced at some stage to palladium metal prior to electrolytic plating. Thus, the palladium compounds can be added directly to the copper colloid if the colloid contains an excess of reducing agent or during the preparation of the colloid if the colloid is prepared by a reduction technique, such as that disclosed in U.S. Pat. Nos. 3,958,048 (Donovan et al.) and 4,762,560 (Brasch). The palladium can also be added to colloids prepared by a precipitation process, such as that disclosed in U.S. Pat. No. 3,993,799 (Feldstein) and the ionic palladium reduced after the colloid has been coated on the substrate by contacting the coated substrate with a reducing agent, such as by immersion or spraying. Preferably, the present palladium containing copper colloid is prepared by adding the ionic palladium to a preformed copper colloid containing excess reducing agent or during the preparation of the colloid using a reduction technique.

Typically, the reduction of the copper compounds initiates at a pH of from about 1.5 to about 4, and preferably from about 2 to about 2.5. The temperature of the reduction reaction is not at all critical. The reaction will take place at room temperature but it is preferable to add a small amount of heat so that the reaction takes place at about 80° to 90° F. Higher temperatures (120° to 130° F.) can be used if desired, but it is the types and amounts of reactants and the pH that mainly control the reaction. The reaction starts out gradually and may take 5 to 10 minutes before it is noticeable. With copper sulfate the onset of the reaction can be observed by color changes, generally from a deep blue to a light blue and then to green. After the first part of the reaction has been completed, as indicated by the color change, any heating or agitation being employed is stopped and the reaction mixture is allowed to stand or further react for about 24 hours. After 24 hours the colloid can be used; however, best results are obtained after the colloid is aged for 3 to 4 weeks in a closed container. Typically, the copper colloid particles have a size of from about 10 to about 100 millimicrons.

The colloid stability may be further enhanced by the addition thereto, after the initial reaction, of an additional reducing agent such as hydrazine hydrate, phenylhydrazine, hydroxylamine sulfate or even additional DMAB (or other reducing agent used in the initial reaction). The additional reducing agent is advantageously added to the colloid after the colloid has been aged or permitted to stand for about 24 hours but can be added at other stages after completion of the initial reaction if desired.

The pH of the colloids after aging for about 24 hours is about 7, and they can be used directly at this advantageous pH but the colloid can be used over a wide pH range. The pH can be adjusted to that desired by the addition of acids (e.g. sulfuric acid) or bases (e.g. alkali hydroxides) as will be appreciated by those skilled in the art. During use, the pH of the colloid may drop but in practice the colloid solution is replenished from time to time with additional colloid which tends to bring the pH back up toward 7. Slightly alkaline colloids are preferred, such as those having a pH of from about 7 to about 8, and preferably from 7.5 to 8.

While the preferred colloid is copper, it will be appreciated by those skilled in the art that other suitable colloids may be used in the present invention, such as nickel, iron or cobalt.

The present copper colloids are used to enhance or repair discontinuities in a metal seed layer disposed on a substrate. Typically, a discontinuous seed layer is contacted with a copper colloid (preferably containing 1 to 2 g/L copper) to provide a colloid coated surface or enhanced seed layer. Such colloid may be applied to the seed layer by a variety of means, such as dipping, spraying, spin coating, flood coating and the like, and preferably by dipping, spraying and spin coating. The colloid substantially fills in or repairs the discontinuities, providing a substantially continuous seed layer. Thus, the copper colloid coated or enhanced seed layers are substantially continuous and preferably continuous. An advantage of the present copper colloid is that the pH of the colloid is about 7 or slightly alkaline. Thus, dissolution of the seed layer, such as metal oxides in the seed layer, is minimized.

After the colloid is disposed on the seed layer, the colloid coated surface may optionally be rinsed, such as with water or an activating solution. Exemplary activating solutions include a reducing agent solution, such as may be necessary to reduce any ionizable palladium to palladium metal (zerovalent palladium). Any of the above described reducing agents are suitable.

The copper colloid enhanced seed layer may then be plated by a variety of metals, but is typically plated with copper. Such plating may be either electroless or electrolytic. Electroless plating may suitably be used to further enhance the seed layer. Such electroless is typically too slow to be used for substantial or complete filling of apertures.

Preferably, the copper colloid enhanced seed layer is electroplated to deposit sufficient metal to substantially fill or completely fill the apertures. Copper electroplating solutions useful in depositing a metal layer on the substantially continuous seed layers of the present invention generally include one or more sources of copper ions and an electrolyte, preferably an acidic electrolyte. The electroplating solutions may optionally contain one or more additives, such as halides, accelerators or brighteners, suppressors, levelers, grain refiners, wetting agents, surfactants and the like.

A variety of copper salts may be employed in copper electroplating solutions as sources of copper ions. Suitable copper salts include, but are not limited to, copper sulfates, copper acetates, copper fluoroborate, copper gluconate, copper formate, copper alkanesulfonates, copper arylsulfonates, copper sulfamates, copper sulfonates, and cupric nitrates. Copper sulfate pentahydrate is particularly suitable. A copper salt may be suitably present in a relatively wide concentration range in these electroplating solutions. Preferably, a copper salt will be employed at a concentration of from about 1 to about 300 g/L of plating solution, more preferably at a concentration of from about 10 to about 225 g/L, still more preferably at a concentration of from about 25 to about 175 g/L. The copper plating bath may also contain amounts of other alloying elements, such as, but not limited to, tin, zinc, and the like. Thus, the copper electroplating baths may also deposit a copper alloy.

Suitable copper electroplating baths preferably employ an acidic electrolyte, which may include one or more acids. Suitable acids are inorganic or organic. Useful inorganic acids include, but are not limited to, sulfuric acid, phosphoric acid, nitric acid, hydrogen halide acids, sulfamic acid, fluoroboric acid and the like. Suitable organic acids include, but are not limited to, alkylsulfonic acids such as methanesulfonic acid, aryl sulfonic acids such as phenylsulfonic acid and tolylsulfonic acid, carboxylic acids such as formic acid, acetic acid and propionic acid, halogenated acids such as trifluoromethylsulfonic acid and haloacetic acid, and the like. Particularly suitable organic acids include ($C_1$–$C_{10}$) alkylsulfonic acids. Particularly suitable combinations of acids include one or more inorganic acids with one or more organic acids or a mixture of two or more organic acids. When two or more acids are used in the electrolyte, they may be used in any ratio from 99:1 to 1:99, preferably from 90:10 to 10:90, and more preferably from 80:20 to 20:80.

The total amount of added acid used in the present electroplating baths may be from about 0 to about 350 g/L, and preferably from 1 to 225 g/L. It will be appreciated by those skilled in the art that by using a metal sulfate as the metal ion source, an acidic electrolyte can be obtained without any added acid. Thus, in one embodiment, copper electroplating solutions may be free of added acid.

For certain applications, such as in the plating of wafers having very small apertures, it is preferred that the total amount of added acid be low. By "low acid" is meant that the total amount of added acid in the electrolyte is less than about 0.4 M, preferably less than about 0.3 M, and more preferably less than about 0.2 M. Particularly preferred low acid electroplating baths are free of added acid., i.e. the amount of added acid is 0 g/L.

The copper electrolytes may optionally contain one or more halides, and preferably do contain at least one halide. Chloride and bromide are preferred halides, with chloride being more preferred. A wide range of halide ion concentrations (if a halide ion is employed) may be suitably utilized, e.g. from about 0 (where no halide ion employed) to 100 ppm of halide ion in the plating solution, more preferably from about 25 to about 75 ppm. Such halides may be added as the corresponding hydrogen halide acid or as any suitable salt.

A wide variety of brighteners and accelerators, including known brightener and accelerator agents, may be employed in copper electroplating solutions. Typical brighteners contain one or more sulfur atoms, and typically without any nitrogen atoms and a molecular weight of about 1000 or less. Brightener compounds that have sulfide and/or sulfonic acid groups are generally preferred, particularly compounds that comprise a group of the formula R'—S—R—SO$_3$X, where R is an optionally substituted alkyl (which include cycloalkyl), optionally substituted heteroalkyl, optionally substituted aryl group, or optionally substituted heteroalicyclic; X is a counter ion such as sodium or potassium; and R' is hydrogen or a chemical bond (i.e. —S—R—SO$_3$X or substituent of a larger compound). Typically alkyl groups will have from one to about 16 carbons, more typically one to about 8 or 12 carbons. Heteroalkyl groups will have one or more hetero (N, O or S) atoms in the chain, and preferably have from 1 to about 16 carbons, more typically 1 to about 8 or 12 carbons. Carbocyclic aryl groups are typical aryl groups, such as phenyl and naphthyl. Heteroaromatic groups also will be suitable aryl groups, and typically contain 1 to about 3 N, O or S atoms and 1–3 separate or fused rings and include e.g. coumarinyl, quinolinyl, pyridyl, pyrazinyl, pyrimidyl, furyl, pyrrolyl, thienyl, thiazolyl, oxazolyl, oxidizolyl, triazole, imidazolyl, indolyl, benzofuranyl, benzothiazol, and the like. Heteroalicyclic groups typically will have 1 to 3 N, O or S atoms and from 1 to 3 separate or fused rings and include e.g. tetrahydrofuranyl, thienyl, tetrahydropyranyl, piperdinyl, morpholino, pyrrolindinyl, and the like. Substituents of substituted alkyl, heteroalkyl, aryl or heteroalicyclic groups include e.g. $C_{1-8}$ alkoxy; $C_{1-8}$ alkyl, halogen, particularly F, Cl and Br; cyano, nitro, and the like.

More specifically, useful brighteners include those of the following formulae:

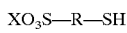

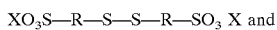

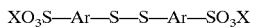

wherein R in the above formulae is an optionally substituted alkyl group, and preferably is an alkyl group having from 1 to 6 carbon atoms, more preferably is an alkyl group having from 1 to 4 carbon atoms; Ar is an optionally substituted aryl group such as optionally substituted phenyl or naphthyl; and X is a suitable counter ion such as sodium or potassium.

Some specific suitable brighteners include e.g. N,N-dimethyl-dithiocarbamic acid-(3-sulfopropyl)ester; 3-mercapto-propylsulfonic acid-(3-sulfopropyl)ester; 3-mercapto-propylsulfonic acid (sodium salt); carbonic acid-dithio-o-ethylester-s-ester with 3-mercapto-1-propane sulfonic acid (potassium salt); bissulfopropyl disulfide; 3-(benzthiazolyl-s-thio)propyl sulfonic acid (sodium salt); pyridinium propyl sulfobetaine; 1-sodium-3-mercaptopropane-1-sulfonate; sulfoalkyl sulfide compounds disclosed in U.S. Pat. No. 3,778,357; the peroxide oxidation product of a dialkyl amino-thiox-methyl-thioalkanesulfonic acid; and combinations of the above. Additional suitable brighteners are also described in U.S. Pat. Nos. 3,770,598, 4,374,709, 4,376,685, 4,555,315, and 4,673,469, all incorporated herein by reference. Particularly preferred brighteners for use in the plating compositions of the invention are N,N-dimethyl-dithiocarbamic acid-(3-sulfopropyl)ester and bis-sodium-sulfonopropyl-disulfide.

The amount of such accelerators present in copper electroplating baths is in the range of from about 0.1 to about 1000 ppm. Preferably, the accelerator compounds are present in an amount of from about 0.5 to about 300 ppm, more preferably from about 1 to about 100 ppm, and still more preferably from about 2 to about 50 ppm. Particularly suitable electroplating solutions are those containing greater than or equal to 1.5 mg/L of one or more brighteners.

The suppressor agents useful in copper electroplating baths are polymeric materials, preferably having heteroatom substitution, particularly oxygen linkages. Generally preferred suppressor agents are generally high molecular weight polyethers, such as those of the following formula:

where R is H or an aryl or alkyl group containing from about 2 to 20 carbon atoms; each X, Y, X' and Y' is independently hydrogen, alkyl preferably methyl, ethyl or propyl, aryl such as phenyl; aralkyl such as benzyl; and preferably one or more of X, Y, X' and Y' is hydrogen; and n is an integer between 5 and 100,000. Preferably, R is ethylene and n is greater than 12,000.

The amount of such suppressors is typically in the range of from about 0.1 to about 1000 ppm. Preferably, the suppressor compounds are present in an amount of from about 0.5 to about 500 ppm, and more preferably from about 1 to about 200 ppm.

Surfactants may optionally be added to copper electroplating baths. Such surfactants are typically added in concentrations ranging from about 1 to 10,000 ppm based on the weight of the bath, more preferably about 5 to 10,000 ppm.

Particularly suitable surfactants are commercially available polyethylene glycol copolymers, including polyethylene glycol copolymers. Such polymers are available from e.g. BASF (sold by BASF under TETRONIC and PLURONIC tradenames), and copolymers from Chemax.

Levelers may optionally be added to the copper electroplating baths. It is preferred that one or more leveler components is used in the present electroplating baths. Such levelers may be used in amounts of from about 0.01 to about 50 ppm. Examples of suitable leveling agents are described and set forth in U.S. Pat. Nos. 3,770,598, 4,374,709, 4,376,685, 4,555,315 and 4,673,459. In general, useful leveling agents include those that contain a substituted amino group such as compounds having R—N—R', where each R and R' is independently a substituted or unsubstituted alkyl group or a substituted or unsubstituted aryl group. Typically the alkyl groups have from 1 to 6 carbon atoms, more typically from 1 to 4 carbon atoms. Suitable aryl groups include substituted or unsubstituted phenyl or naphthyl. The substituents of the substituted alkyl and aryl groups may be, for example, alkyl, halo and alkoxy.

More specifically, suitable leveling agents include, but are not limited to, 1-(2-hydroxyethyl)-2-imidazolidinethione; 4-mercaptopyridine; 2-mercaptothiazoline; ethylene thiourea; thiourea; alkylated polyalkyleneimine; phenazonium compounds disclosed in U.S. Pat. No. 3,956,084; N-heteroaromatic rings containing polymers; quaternized, acrylic, polymeric amines; polyvinyl carbamates; pyrrolidone; and imidazole. A particularly preferred leveler is 1(2-hydroxyethyl)-2-imidazolidinethione.

The substantially continuous seed layers of the present invention are typically plated or metallized by contacting the seed layer with the above described electroplating bath. The seed layer is typically contacted with the electroplating solution for a period of time and at a current density sufficient to deposit the desired thickness of metal on the seed layer. Copper plating baths are preferably employed at a wide range of temperatures from below room temperature to above room temperature, e.g. up to 65° C. and greater. The plating bath is preferably agitated during use such as by air sparger, work piece agitation, impingement or other suitable method. Plating is preferably conducted at a current ranging from 1 to 40 ASF depending upon substrate characteristics. Plating time may range from about 2 minutes to 1 hour or more, depending on the difficulty of the work piece.

A wide variety of substrates may be plated with the compositions of the invention, as discussed above. The compositions of the invention are particularly useful to plate difficult work pieces, such as circuit board substrates with small diameter, high aspect ratio microvias and other apertures. The plating compositions of the invention also will be particularly useful for plating integrated circuit devices, such as formed semiconductor devices and the like. The methods of the present invention are particularly suitable for providing substantially continuous seed layers on substrates having high aspect ratio microvias and trenches, such as those having aspect rations of 4:1 or greater.

As discussed above, aspect ratios of at least 4:1, having diameters of about 200 nm or smaller can be effectively copper plated with no defects (e.g. no voids or inclusions by ion beam examination) on the substantially continuous seed layers of the invention. Seed layers on substrates including apertures with diameters below 150 nm, or even below about 100 nm, and aspect ratios of 5:1, 6:1, 7:1, 10:1 or greater, and even up to about 15:1 or greater can be effectively enhanced using the present invention. The present invention is particularly suitable for repairing seed layers on substrates having 0.18 μm and smaller apertures.

Thus, the present invention provides a method of electrodepositing a metal layer on the surface of a seed layer including the steps of: contacting a metal seed layer disposed on a substrate with a copper colloid composition including a minor amount of ionizable palladium compound and a major amount of copper colloid particles to form a substantially continuous seed layer; and contacting the substrate with an electroplating solution including one or more metal ions and an electrolyte.

Also provided by the present invention is a method of manufacturing an electronic device including the steps of: contacting a metal seed layer disposed on an electronic device substrate with a copper colloid composition including a minor amount of ionizable palladium compound and a major amount of copper colloid particles to form a substantially continuous seed layer; and contacting the seed layer with an electroplating solution including one or more metal ions and an electrolyte. Preferably such electronic device is an integrated circuit. It is further preferred that the electronic device substrate is a wafer used in the manufacture on an integrated circuit.

Accordingly, the present invention also provides an electronic device substrate containing one or more apertures, each aperture containing a seed layer deposit enhanced by the method described above.

After seed layer repair treatment according to the present invention, the substrate is contacted with a conventional metallization bath, such as an acid copper bath, to fill or substantially fill the apertures. After metallization, i.e. filling of the apertures with a metal, the substrate, in the case of a wafer, is preferably subjected to chemical-mechanical planarization ("CMP"). A CMP procedure can be conducted in accordance with the invention as follows.

The wafer is mounted in a wafer carrier which urges the wafer against the surface of a moving polishing pad. The polishing pad can be a conventional smooth polishing pad or a grooved polishing pad. Such grooved pads are well known in the art, such as those available from Rodel, Inc., Newark, Del. The polishing pad can be located on a conventional platen which can rotate the polishing pad. The polishing pad can be held on the platen by a holding means such as, but not limited to, an adhesive, such as, two faced tape having adhesive on both sides.

A polishing solution or slurry is fed onto the polishing pad. The wafer carrier can be at different positions on the polishing pad. The wafer can be held in position by any suitable holding means such as, but is not limited to, a wafer holder, vacuum or liquid tensioning such as, but not limited to a fluid such as, but not limited to water. If the holding means is by vacuum then there is preferably a hollow shaft which is connected to the wafer carrier. Additionally, the hollow shaft could be used to regulate gas pressure, such as, but not limited to air or an inert gas or use a vacuum to initially hold the wafer. The gas or vacuum would flow from the hollow shaft to the carrier. The gas can urge the wafer against the polishing pad for the desired contour. The vacuum can initially hold the wafer into position in the wafer carrier. Once the wafer is located on top of the polishing pad the vacuum can be disengaged and the gas pressure can be engaged to thrust the wafer against the polishing pad. The excess or unwanted copper is then removed. The platen and wafer carrier can be independently rotatable. Therefore, it is possible to rotate the wafer in the same direction as the polishing pad at the same or different speed or rotate the wafer in the opposite direction as the polishing pad.

Thus, the present invention provides a method for removing excess material from a semiconductor wafer by using a chemical mechanical planarization process which includes contacting the semiconductor wafer with a rotating polishing pad thereby removing the excess material from the semiconductor wafer; wherein the semiconductor wafer contains a seed layer which has been prior enhanced according the method described above.

Also provided is a method for removing excess material from a semiconductor wafer containing one or more apertures having a size of ≦1 μm, by using a chemical mechanical planarization process which includes contacting the semiconductor wafer with a rotating polishing pad thereby removing the excess material from the semiconductor wafer; wherein the apertures contain a seed layer which has been prior enhanced according the method described above.

While the present invention has been described with respect to copper electroplating baths, it will be appreciated by those skilled in the art that the substantially continuous seed layers of the present invention may be electroplated using a variety of plating baths, such as tin, tin alloy, nickel, nickel-alloy, and the like.

EXAMPLE 1

A copper colloid bath is prepared incorporating palladium ammonium chloride, in accordance with Example 4 of U.S. Pat. No. 4,681,630 (Brasch). A silicon wafer substrate having a discontinuous physical vapor deposited ("PVD") copper seed layer over a tantalum nitride ("TaN") barrier is contacted with the copper colloid bath at a temperature of 30° C. for 10 minutes. The wafer substrate is then rinsed with de-ionized water and is then contacted with an activating solution, such as a dilute fluoroboric acid bath for 30 seconds, prior to rinsing and contacting the substrate with an electrolytic copper plating bath, such as that sold by Shipley Company (Marlborough, Mass.) under the ULTRAFILL 2001 trademark. Following copper deposition and void-free gap-fill, the substrate is rinsed and subjected to further processing.

EXAMPLE 2

A copper colloid bath is prepared incorporating palladium ammonium chloride, in accordance with Example 4 of U.S. Pat. No. 4,681,630 (Brasch). A silicon wafer substrate having a discontinuous PVD copper seed layer over a TaN barrier is contacted with the copper colloid bath at a temperature of 30° C. for 10 minutes. The wafer substrate is then rinsed with de-ionized water and is then contacted with an activating solution, such as a dilute fluoroboric acid bath, for 30 seconds prior to rinsing and contacting the substrate with a standard slow rate electroless copper bath. After plating for 10 minutes at 25° C., 100% copper coverage of the wafer substrate is obtained. Following rinsing, the wafer substrate is then annealed by placing the wafer on a hot plate for 60 seconds in an atmosphere having reduced oxygen content. The temperature of the hot plate is 200° C. The wafer substrate is then removed from the hot plate and cooled. Once cooled, the wafer substrate is then metallized by subjecting the wafer substrate to an electrolytic copper plating bath such as that sold by Shipley Company (Marlborough, Mass.) under the ULTRAFILL 2001 trademark. The wafer substrate is placed in the electrolytic plating bath for a sufficient period of time to provide the desired copper layer. The wafer substrate is then removed from the electrolytic plating bath, rinsed with de-ionized water and subjected to further processing.

What is claimed is:

1. A method of electrodepositing a metal layer on the surface of a discontinuous metal seed layer comprising the steps of: contacting the discontinuous metal seed layer disposed on an integrated circuit substrate with a copper colloid composition comprising a minor amount of ionizable palladium compound and a major amount of copper colloid particles to form a substantially continuous metal seed layer; and electrodepositing a metal layer on the substrate with an electroplating solution comprising one or more metal ions and an electrolyte, wherein the integrated circuit substrate has one or more apertures having a size of ≦1 μm.

2. The method of claim 1 wherein the metal seed layer is a copper seed layer.

3. The method of claim 1 wherein the palladium compound is present in an amount sufficient to provide from about 5 to about 80 ppm of palladium metal.

4. The method of claim 1 wherein the copper colloid composition comprises copper metal in an amount of from 1 to 8 g/L of colloidal solution.

5. The method of claim 1 wherein the copper colloid has a pH of from about 7 to about 8.

6. The method of claim 1 wherein the one or more metal ions are selected from copper sulfates, copper acetates, copper fluoroborate, copper gluconate, copper formate, copper alkanesulfonates, copper arylsulfonates, copper sulfonates, or cupric nitrates.

7. The method of claim 1 wherein the electrolyte is acidic.

8. The method of claim 1 wherein the electroplating solution further comprises one or more additives selected from halides, brighteners, suppressors, levelers, grain refiners, wetting agents or surfactants.

9. The method of claim 8 wherein the brighteners are present in an amount of greater than or equal to 1.5 mg/L.

10. A method of manufracturing an integrated circuit device comprising the steps of: contacting a discontinuous metal seed layer disposed on an integrated circuit device substrate with a copper colloid composition comprising a minor amount of ionizable palladium compound and a major amount of copper colloid particles to form a copper colloid surface; and electrodepositing a metal layer on the integrated circuit device substrate with an electroplating solution comprising one or more metal ions and an electrolyte, wherein the integrated circuit device substrate has one or more apertures having a size of ≦1 μm.

11. The method of claim 10 wherein the metal seed layer is a copper seed layer.

12. The method of claim 10 wherein the palladium compound is present in an amount sufficient to provide from about 5 to about 80 ppm of palladium metal.

13. The method of claim 10 wherein the copper colloid composition comprises copper metal in an amount of from 1 to 8 g/L of colloidal solution.

14. The method of claim 10 wherein the copper colloid has a pH of from about 7 to about 8.

15. The method of claim 10 wherein the one or more metal ions are selected from copper sulfates, copper acetates, copper fluoroborate, copper gluconate, copper formate, copper alkanesulfonates, copper arylsulfonates, copper sulfonates, or cupric nitrates.

16. The method of claim 10 wherein the electrolyte is acidic.

17. The method of claim 10 wherein the electroplating solution further comprises one or more additives selected from halides, brighteners, suppressors, levelers, grain refiners, wetting agents or surfactants.

18. The method of claim 17 wherein the brighteners are present in an amount of greater than or equal to 1.5 mg/L.

* * * * *